(12) United States Patent
Zhang et al.

(10) Patent No.: US 12,191,892 B2
(45) Date of Patent: Jan. 7, 2025

(54) DATA COMPRESSION METHOD AND APPARATUS, AND STORAGE MEDIUM

(71) Applicant: DATANG MOBILE COMMUNICATIONS EQUIPMENT CO., LTD., Beijing (CN)

(72) Inventors: Huiying Zhang, Beijing (CN); Haiyang Quan, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/018,882

(22) PCT Filed: Jun. 21, 2021

(86) PCT No.: PCT/CN2021/101204
§ 371 (c)(1),
(2) Date: Jan. 31, 2023

(87) PCT Pub. No.: WO2022/028133
PCT Pub. Date: Feb. 10, 2022

(65) Prior Publication Data
US 2024/0275405 A1  Aug. 15, 2024

(30) Foreign Application Priority Data
Aug. 5, 2020 (CN) .......................... 202010779019.6

(51) Int. Cl.
*H03M 7/30* (2006.01)
*G06F 12/0875* (2016.01)
*G06F 16/174* (2019.01)

(52) U.S. Cl.
CPC ....... *H03M 7/6082* (2013.01); *H03M 7/6011* (2013.01); *G06F 12/0875* (2013.01); *G06F 16/1744* (2019.01)

(58) Field of Classification Search
CPC .... H03M 7/6082; H03M 7/6011; H03M 7/38; G06F 16/1744; G06F 12/0875
See application file for complete search history.

(56) References Cited

U.S. PATENT DOCUMENTS 10,803,018 B2 * 10/2020 Constantinescu ... G06F 16/1744
2019/0149421 A1    5/2019 Jin et al.

FOREIGN PATENT DOCUMENTS

CN    109842653 A    6/2019
CN    109842905 A    6/2019

(Continued)

*Primary Examiner* — Joseph J Lauture
(74) *Attorney, Agent, or Firm* — Kilpatrick Townsend & Stockton LLP

(57) ABSTRACT

Provided are a data compression method and apparatus, and a storage medium. The method is used for a data sending end; the data sensing end can carry services on a radio bearer, and each service corresponds to a compression buffer. The method includes determining a first compression buffer corresponding to a service to which first data block to be sent belongs, compressing the first data block using a dictionary corresponding to the first compression buffer to obtain compressed second data block, encapsulating the second data block in a set message, and adding, to the set message, a compression identifier used for indicating the first compression buffer, and sending, to a data receiving end, the set message carrying the compression identifier, present invention, data compression efficiency is improved, and efficient transmission of a data receiving end, the set message carrying the compression identifier.

20 Claims, 6 Drawing Sheets

(56) References Cited

FOREIGN PATENT DOCUMENTS

| CN | 110139317 | A | 8/2019 |
|---|---|---|---|
| CN | 110401604 | A | 11/2019 |
| CN | 110958643 | A | 4/2020 |
| WO | 2020091410 | A1 | 5/2020 |

* cited by examiner

| D/C | R | R | R | PDCP SN | Oct 1 |
|---|---|---|---|---|---|
| PDCP SN (cont.) | | | | | Oct 2 |
| FU | FR | Buffer ID | | Checksum | Oct 3 |
| UDC Data Block | | | | | Oct 4 |

| D/C | R | R | R | PDCP SN | Oct 1 |
| --- | --- | --- | --- | --- | --- |
| PDCP SN (cont.) | | | | | Oct 2 |
| FU | FR | R | R | Checksum | Oct 3 |
| Buffer ID | | R | R | R | R | Oct 4 |
| UDC Data Block | | | | | Oct 5 |

DATA COMPRESSION METHOD AND APPARATUS, AND STORAGE MEDIUM

CROSS-REFERENCE TO RELATED APPLICATION

The present application is a National Stage of International Application No. PCT/CN2021/101204, filed on Jun. 21, 2021, which claims priority to Chinese Patent Application No. 202010779019.6, filed on Aug. 5, 2020, entitled "Data Compression Method and Apparatus, and Storage Medium", which are hereby incorporated by reference in their entireties.

FIELD

The present application relates to the field of communication technologies, in particular to methods and apparatuses for compressing a data block, and a storage medium.

BACKGROUND

In communication systems, it is a common data transmission method to compress a data block first and then transmit it.

In a traditional method of data compression and transmission, only one compression/decompression buffer corresponds to one compression dictionary, which results in a low compression efficiency.

Therefore, how to improve data compression efficiency is an urgent problem to be solved at present.

SUMMARY

Embodiments of the present application provide methods and apparatuses for compressing a data block, and a storage medium which can solve the defect of low efficiency of data compression in the related art and efficiently transmit multiple services.

A method for compressing a data block according to an embodiment of the present application, performed by a data transmitting terminal which can carry multiple services on a radio bearer, where each service corresponds to a compression buffer. The method includes:
  determining a first compression buffer corresponding to a service to which a first data block to be transmitted belongs;
  compressing the first data block using a dictionary corresponding to the first compression buffer to obtain a compressed second data block;
  packaging the second data block into a protocol data unit (PDU) and adding a compression identifier for indicating the first compression buffer in a PDU header; and
  transmitting the PDU carrying the compression identifier to a data receiving terminal.

In an embodiment, in the method for compressing the data block according to the embodiment of the present application, the PDU is a packet data convergence protocol (PDCP) PDU;
  the adding a compression identifier for indicating the first compression buffer in a PDU header includes:
  adding the compression identifier in a PDCP header of the PDCP PDU.

In an embodiment, in the method for compressing the data block according to the embodiment of the present application, the adding the compression identifier in a PDCP header of the PDCP PDU includes:
  determining a setting field for carrying the compression identifier in the PDCP header; and
  adding the compression identifier in the setting field.

In an embodiment, in the method for compressing the data block according to the embodiment of the present application, the compression identifier includes one or more of the following items:
  a compression buffer identifier of the first compression buffer;
  a dictionary identifier corresponding to the first compression buffer;
  a service identifier corresponding to the first compression buffer.

In an embodiment, the method for compressing the data block according to the embodiment of the present application, further includes:
  receiving a first message transmitted by a network device, where the first message includes compression information configured by the network device for a service to be compressed; and
  establishing a compression buffer corresponding to the service to be compressed according to the compression information.

In an embodiment, in the method for compressing the data block according to the embodiment of the present application, the compression information includes one or more of the following items:
  a compression buffer identifier and/or a decompression buffer identifier;
  a dictionary identifier;
  compression buffer information and/or decompression buffer information;
  a service identifier.

In an embodiment, the method for compressing the data block according to the embodiment of the present application further includes:
  receiving a second message transmitted by the network device, where the second message includes release information configured by the network device for a service to be released; and
  releasing a compression buffer corresponding to the service to be released according to the release information.

In an embodiment, in the method for compressing the data block according to the embodiment of the present application, the release information includes one or more of the following items:
  a compression buffer identifier and/or a decompression buffer identifier;
  a dictionary identifier;
  a service identifier.

In an embodiment, the method for compressing the data block according to the embodiment of the present application further includes:
  updating a content of the dictionary corresponding to the first compression buffer with the first data block.

A method for compressing a data block according to an embodiment of the present application, performed by a data receiving terminal which can receive multiple compressed services carried on a radio bearer, where each service corresponds to a decompression buffer. The method includes:
  receiving a protocol data unit (PDU) carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer;

determining a first decompression buffer corresponding to the first compression buffer according to the compression identifier; and decompressing the second data block using a dictionary corresponding to the first decompression buffer to obtain the first data block.

In an embodiment, in the method for compressing the data block according to the embodiment of the present application, the PDU is a packet data convergence protocol (PDCP) PDU; and a PDCP header of the PDCP PDU includes the compression identifier.

In an embodiment, in the method for compressing the data block according to the embodiment of the present application, a setting field for carrying the compression identifier in the PDCP header includes the compression identifier.

In an embodiment, in the method for compressing the data block according to the embodiment of the present application, the compression identifier includes one or more of the following items:

a compression buffer identifier of the first compression buffer;

a dictionary identifier corresponding to the first compression buffer;

a service identifier corresponding to the first compression buffer.

In an embodiment, the method for compressing the data block according to the embodiment of the present application, further includes:

receiving a first message transmitted by a network device, where the first message includes compression information configured by the network device for a service to be compressed; and establishing a decompression buffer corresponding to the service to be compressed according to the compression information.

In an embodiment, in the method for compressing the data block according to the embodiment of the present application, the compression information includes one or more of the following items:

a compression buffer identifier and/or a decompression buffer identifier;

a dictionary identifier;

compression buffer information and/or decompression buffer information;

a service identifier.

In an embodiment, the method for compressing the data block according to the embodiment of the present application, further includes:

receiving a second message transmitted by the network device, where the second message includes release information configured by the network device for a service to be released; and releasing a decompression buffer corresponding to the service to be released according to the release information.

In an embodiment, in the method for compressing the data block according to the embodiment of the present application, the release information includes one or more of the following items:

a compression buffer identifier and/or a decompression buffer identifier;

a dictionary identifier;

a service identifier.

In an embodiment, the method for compressing the data block according to the embodiment of the present application, further includes:

updating a content of the dictionary corresponding to the first decompression buffer with the first data block.

An apparatus for compressing a data block according to an embodiment of the present application, which can carry multiple services on a radio bearer, where each service corresponds to a compression buffer, including a memory, a transceiver, and a processor, where the memory is used for storing computer programs, the transceiver is used for receiving and transmitting the data block under a control of the processor, and the processor is used for reading the computer programs in the memory and performing the following operations:

determining a first compression buffer corresponding to a service to which a first data block to be transmitted belongs;

compressing the first data block using a dictionary corresponding to the first compression buffer to obtain a compressed second data block;

packaging the second data block into a protocol data unit (PDU) and adding a compression identifier for indicating the first compression buffer in a PDU header; and transmitting the PDU carrying the compression identifier to a data receiving terminal.

In an embodiment, in the apparatus for compressing a data block according to the embodiment of the present application, the PDU is a packet data convergence protocol (PDCP) PDU;

the adding a compression identifier for indicating the first compression buffer in a PDU header includes:

adding the compression identifier in a PDCP header of the PDCP PDU.

In an embodiment, in the apparatus for compressing a data block according to the embodiment of the present application, the adding the compression identifier in a PDCP header of the PDCP PDU includes:

determining a setting field for carrying the compression identifier in the PDCP header; and adding the compression identifier in the setting field.

In an embodiment, in the apparatus for compressing a data block according to the embodiment of the present application, the compression identifier includes one or more of the following items:

a compression buffer identifier of the first compression buffer;

a dictionary identifier corresponding to the first compression buffer;

a service identifier corresponding to the first compression buffer.

In an embodiment, the apparatus for compressing a data block according to the embodiment of the present application, the processor further performs the following operations:

receiving a first message transmitted by network device, where the first message includes compression information configured by the network device for a service to be compressed; and establishing a compression buffer corresponding to the service to be compressed according to the compression information.

In an embodiment, in the apparatus for compressing a data block according to the embodiment of the present application, the compression information includes one or more of the following items:

a compression buffer identifier and/or a decompression buffer identifier;

a dictionary identifier;

compression buffer information and/or decompression buffer information;

a service identifier.

In an embodiment, the apparatus for compressing a data block according to the embodiment of the present application, the processor further performs the following operations:

receiving a second message transmitted by the network device, where the second message includes release information configured by the network device for a service to be released; and releasing a compression buffer corresponding to the service to be released according to the release information.

In an embodiment, in the apparatus for compressing a data block according to the embodiment of the present application, the release information includes one or more of the following items:

a compression buffer identifier and/or a decompression buffer identifier;

a dictionary identifier;

a service identifier.

In an embodiment, the apparatus for compressing a data block according to the embodiment of the present application, the processor further performs the following operations:

updating a content of the dictionary corresponding to the first compression buffer with the first data block.

An apparatus for compressing a data block according to an embodiment of the present application, which can receive multiple services carried on a radio bearer, where each service corresponds to a compression buffer, includes a memory, a transceiver, and a processor, where the memory is used for storing computer programs, the transceiver is used for receiving and transmitting the data block under a control of the processor, and the processor is used for reading the computer programs in the memory and performing the following operations:

receiving a protocol data unit (PDU) carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer;

determining a first decompression buffer corresponding to the first compression buffer according to the compression identifier; and decompressing the second data block using a dictionary corresponding to the first decompression buffer to obtain the first data block.

In an embodiment, in the apparatus for compressing a data block according to the embodiment of the present application, the PDU is a packet data convergence protocol (PDCP) PDU; and a PDCP header of the PDCP PDU includes the compression identifier.

In an embodiment, in the apparatus for compressing a data block according to the embodiment of the present application, a setting field for carrying the compression identifier in the PDCP header includes the compression identifier.

In an embodiment, in the apparatus for compressing a data block according to the embodiment of the present application, the compression identifier includes one or more of the following items:

a compression buffer identifier of the first compression buffer;

a dictionary identifier corresponding to the first compression buffer;

a service identifier corresponding to the first compression buffer.

In an embodiment, the apparatus for compressing a data block according to the embodiment of the present application, the processor further performs the following operations:

receiving a first message transmitted by a network device, where the first message includes compression information configured by the network device for a service to be compressed; and establishing a decompression buffer corresponding to the service to be compressed according to the compression information.

In an embodiment, in the apparatus for compressing a data block according to the embodiment of the present application, the compression information includes one or more of the following items:

a compression buffer identifier and/or a decompression buffer identifier;

a dictionary identifier;

compression buffer information and/or decompression buffer information;

a service identifier.

In an embodiment, the apparatus for compressing a data block according to the embodiment of the present application, the processor further performs the following operations:

receiving a second message transmitted by the network device, where the second message includes release information configured by the network device for a service to be released; and releasing a decompression buffer corresponding to the service to be released according to the release information.

In an embodiment, in the apparatus for compressing a data block according to the embodiment of the present application, the release information includes one or more of the following items:

a compression buffer identifier and/or a decompression buffer identifier;

a dictionary identifier;

a service identifier.

In an embodiment, the apparatus for compressing a data block according to the embodiment of the present application, the processor further performs the following operations:

updating a content of the dictionary corresponding to the first decompression buffer with the first data block.

An apparatus for compressing a data block according to an embodiment of the present application, applying to a data transmitting terminal which can carry multiple services on a radio bearer, where each service corresponds to a compression buffer, the apparatus includes:

a compression buffer determining device, configured to determine a first compression buffer corresponding to a service to which a first data block to be transmitted belongs;

a compressing device, configured to compress the first data block using a dictionary corresponding to the first compression buffer to obtain a compressed second data block;

a packaging device, configured to package the second data block into a protocol data unit (PDU) and add a compression identifier for indicating the first compression buffer in a PDU header; and a transmitting device, configured to transmit the PDU carrying the compression identifier to a data receiving terminal.

An apparatus for compressing a data block according to an embodiment of the present application, applying to a data receiving terminal which can receive multiple compressed services carried on a radio bearer, where each service corresponds to a decompression buffer, the apparatus includes:

a receiving device, configured to receive a protocol data unit (PDU) carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer;

a decompression buffer determining device, configured to determine a first decompression buffer corresponding to the first compression buffer according to the compression identifier; and a decompressing device, configured to decompress the second data block using a dictionary corresponding to the first decompression buffer to obtain the first data block.

A processor readable storage medium according to an embodiment of the present application, storing computer programs, where the computer programs, when executed by the processor, cause the processor to perform any one of the above methods for compressing the data block.

In the methods and apparatuses for compressing the data block, and storage medium according to the embodiments of the present application, by determining the first compression buffer corresponding to the service to which the first data block to be transmitted belongs, compressing the first data block using the dictionary corresponding to the first compression buffer to obtain the compressed second data block, packaging the second data block into the PDU and adding the compression identifier for indicating the first compression buffer in the PDU header, and transmitting the PDU carrying the compression identifier to the data receiving terminal, efficiency of data block compression is improved and the multiple services are efficiently transmitted.

BRIEF DESCRIPTION OF DRAWINGS

In order to clearly illustrate the solutions according to the embodiments of the present application or the related art, the accompanying drawings used in the description of the embodiments or the related art are briefly introduced below. It should be noted that the drawings in the following description are only some embodiments of the present application.

DETAILED DESCRIPTION OF THE EMBODIMENTS

Figure 1:
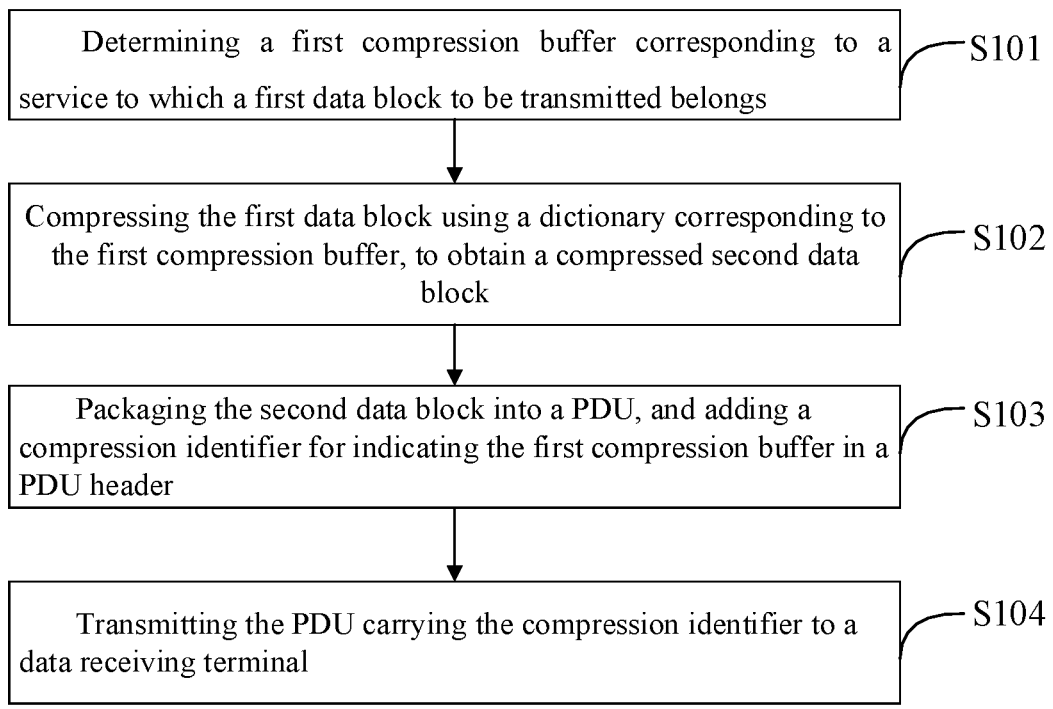
FIG. 1 is a schematic flowchart diagram of a method for compressing a data block according to an embodiment of the present application.

The term "and/or" in the embodiments of the present application describes three situations of the related objects. For example, A and/or B can represent three situations: only A, A and B together, and only b. The character "/" generally represents that the two objects on two sides have a relationship of "or".

The terms "multiple" in the embodiments of the present application refer to two or more, and other quantifiers are similar to them.

The solutions according to the present application are clearly and completely described below in combination with the accompanying drawings in the embodiments of the present application. It should be noted that the described embodiments are some embodiments of the present application, rather than all the embodiments.

In a long term evolution (LTE)/long term evolution advance (LTE-A) system, a network device can configure user equipment (UE) to use uplink data compression (UDC) function to compress the uplink data before transmitting, to reduce the payload of radio resources.

In case that the uplink compression is performed, UE can compress a data block to be transmitted using a preset dictionary content to further improve the compression efficiency. A base station needs to perform decompress according to the preset dictionary content.

In traditional UDC mechanism, one radio bearer (RB) has only one compression/decompression buffer, and corresponds to one compression dictionary. If only one service is carried on one RB, it is no problem to use one dictionary for compression and decompression. However, if multiple services are carried on one RB, the multiple services use the same dictionary for compression and decompression, and then the compression efficiency is greatly reduced due to the lack of correlation between the data of the multiple services.

In the related art, there is no a mechanism to use multiple compression dictionaries and compression/decompression buffers on a radio bearer. The present application provides a method for compressing a data block, which can be applied to that one radio bearer carries multiple services. By this method, the multiple services transmitted on one bearer use multiple dictionaries for compression and decompression, to efficiently transmit the multiple services.

I. UDC Compression Mechanism

1. A transmitting terminal maintains a compression buffer, a receiving side maintains a decompression buffer, and both the compression buffer and the decompression buffer are first in first out queues.
2. The transmitting terminal compresses a data block to be transmitted first before transmitting the data block.
   (1) In a packet to be transmitted, a target field that meets the following properties is searched: a length being greater than a preset threshold, and the target field being the same as a field before the target field in the compression buffer or the packet.
   (2) In case that the target field is found, a field A is replaced with a combination of an offset and a length, where the offset is a location offset between the target field and the same field as the target field before the target field, and the length is a length of the target field.
   Since the length of the combination of the offset and the length is shorter than the length of the target field, a compression effect is achieved. Multiple fields in one packet may meet the above properties and these fields can be compressed.
3. The transmitting terminal transmits the compressed packet to the receiving terminal, and fills the corresponding original packet (uncompressed data block) into the compression buffer.
4. The receiving terminal decompresses a received packet based on the offset and length of the received packet and the decompression buffer, and fills the decompressed packet into the decompressed buffer.

Based on the above principle, at the beginning of UDC, both the compression buffer and the decompression buffer are empty, the probability of the compression side finding the target field in the current packet to be transmitted is low, and the compression efficiency is accordingly low. After UDC runs for a period of time, the compression buffer gradually increases, the probability of the compression side finding the target field in the current packet to be transmitted is improved, and the compression efficiency is improved accordingly.

In UDC, the transmitting terminal includes a user equipment (UE) and the receiving terminal includes a base station.

II. Compression Mechanism Based on Preset Dictionary

As an optimization of UDC, fields with high frequency can be compiled into a preset dictionary based on service properties, and before UDC starts, the preset dictionary can be stored in the compression buffer at the compression side and the decompression buffer of the decompression side.

At the beginning of UDC, the compression buffer and the decompression buffer are no longer empty but store the preset dictionary of the fields with high frequency, which can effectively improve the probability of finding the target field and improve the compression efficiency.

However, in order to achieve the above mechanism, the UE and the base station need to obtain the preset dictionary to be used respectively before the UDC is started, that is, to complete the synchronization process of the preset dictionary.

In the traditional UDC mechanism, one radio bearer (RB) has only one compression/decompression buffer, and corresponds to one compression dictionary. If only one service is carried on one RB, it is no problem to use one dictionary for compression and decompression. However, if multiple services are carried on one RB, the multiple services use the same dictionary for compression and decompression, and then the compression efficiency is greatly reduced due to the lack of correlation between the data block of the multiple services Embodiments of the present application provide methods and apparatuses for compressing a data block, and a storage medium, which can improve the data compression efficiency and efficiently transmit multiple services.

The methods and apparatuses are based on the same conception. Since the principles of the method and apparatus to solve the problems are similar, the implementation of the apparatus and method can be referred to each other, and the same part will not be repeated.

The solutions according to the embodiments of the present application can be applied to many systems, especially a 5G system. For example, the applicative system can be global system of a mobile communication (GSM) system, a code division multiple access (CDMA) system, a wide-band code division multiple access (WCDMA) general packet radio service (GPRS) system, a long term evolution (LTE) system, a LTE frequency division duplex (FDD) system, a LTE time division duplex (TDD) system, a long term evolution advanced LTE-A system, an universal mobile telecommunication system (UMTS), a worldwide interoperability for microwave access (WiMAX) system, a 5G new radio (NR) system, etc. These systems all include a terminal device and a network device. These systems can further include a core network, such as evolved packet system (EPS), 5G system (5GS), etc.

The terminal device in the embodiments of the present application can be a device that provides voice and/or data connectivity to users, a handheld device with wireless connection function, or other processing devices connected to wireless modems. The name of the terminal device may be different in different systems. For example, in 5G system, the terminal device can be called user equipment (UE). The wireless terminal device can communicate with one or more core networks (CN) through a radio access network (RAN). The wireless terminal device can be mobile terminal device, such as a mobile phone (or a "cellular" phone) and a computer with a mobile terminal device, such as portable, pocket, handheld, computer built-in or vehicle mounted mobile devices, which can exchange language and/or data with the wireless access network. For example, a personal communication service (PCS) phone, a cordless phone, a session initiated protocol (SIP) phone, a wireless local loop (WLL) station, a personal digital assistant (PDA) and other devices. A wireless terminal device can also be called system, subscriber unit, subscriber station, mobile station, mobile, remote station, access point, remote terminal, access terminal, user terminal, user agent, user device, etc., which is not limited in the embodiments of the application.

The network device in the embodiments of the present application can be a base station which can include multiple cells providing services for the terminal. Depending on the specific application, the base station can be called an access point, or can be a device communicating with the wireless terminal device through one or more sectors on the air interface in the access network, or can be other names. The network device can be used to replace the received air frame and internet protocol (IP) group with each other as a router between the wireless terminal device and the rest of the access network, where the rest of the access network can include the internet protocol (IP) communication network. The network device can also coordinate the attribute management of the air interface. For example, the network device in the embodiments of the present application can be base transceiver station (BTS) in global system for mobile communications (GSM) or code division multiple access (CDMA), or NodeB in wide-band code division multiple access (WCDMA), or evolutional node B (eNB or e-NodeB) in long term evolution (LTE) system, 5G base station (gNB) in next generation system, or a home evolved node B (HeNB), a relay node, a femto cell, a pico cell, etc., which is not limited in the embodiments of the present application. In some network structures, network device can include centralized unit (CU) nodes and distributed unit (DU) nodes, where the centralized units and distributed units can be arranged separately in geography.

The present application is explained by embodiments as follows.

FIG. 1 is a schematic flowchart diagram of a method for compressing the data block according to an embodiment of the present application. The method is performed by a data transmitting terminal. The data transmitting terminal can carry multiple services on a radio bearer and each service corresponds to one compression buffer. As shown in FIG. 1, the method for compressing the data block includes the following steps.

S101, determining a first compression buffer corresponding to a service to which a first data block to be transmitted belongs.

For example, the data transmitting terminal determines the first compression buffer corresponding to the service to which the first data block to be transmitted belongs. The data transmitting terminal here can be a base station or a user equipment (UE).

For example, in case that the data transmitting terminal is the UE, the UE determines the first compression buffer corresponding to the service to which the first data block to be transmitted belongs; and in case that the data transmitting terminal is a base station, the base station determines the first compression buffer corresponding to the service to which the first data block to be transmitted belongs.

S102, compressing the first data block using a dictionary corresponding to the first compression buffer, to obtain a compressed second data block.

For example, the data transmitting terminal compresses the first data block to be transmitted using the dictionary corresponding to the first compression buffer corresponding to the service to which the first data block belongs, to obtain the compressed second data block. The data transmitting terminal here can be a base station or the UE.

For example, in case the data transmitting terminal is a UE, the UE compresses the first data block to be transmitted using the dictionary corresponding to the first compression buffer corresponding to the service to which the first data block belongs, to obtain the compressed second data block; and in case that the data transmitting terminal is a base station, the base station compresses the first data block to be transmitted using the dictionary corresponding to the first compression buffer corresponding to the service to which the first data block belongs, to obtain a compressed second data block.

In an embodiment, the dictionary corresponding to the first compression buffer can be located in the first compression buffer, for example, the dictionary can be a dictionary pre-filled in the first compression buffer; or the dictionary corresponding to the first compression buffer can be located outside the first compression buffer, for example, the dictionary can be a dictionary associated in advance with the first compression buffer.

S103, packaging the second data block into a protocol data unit (PDU), and adding a compression identifier for indicating the first compression buffer in a PDU header.

For example, the data transmitting terminal packages the compressed second data block into the PDU and adds the compression identifier for indicating the first compression buffer in the PDU header. The data transmitting terminal here can be a base station or a UE.

For example, in case that the data transmitting terminal is a UE, the UE packages the compressed second data block into the PDU and adds the compression identifier for indicating the first compression buffer in the PDU header; and in case that the data transmitting terminal is a base station, the base station packages the compressed second data block into the PDU and adds the compression identifier for indicating the first compression buffer in the PDU header.

S104, transmitting the PDU carrying the compression identifier to a data receiving terminal.

For example, the data transmitting terminal transmits the PDU carrying the compression identifier for indicating the first compression buffer to the data receiving terminal. The data transmitting terminal here can be a base station or a UE. In case that the data transmitting terminal is the UE, the data receiving terminal is a base station. In case that the data transmitting terminal is a base station, the data receiving terminal is a UE.

For example, in case that the data transmitting terminal is a UE, the UE transmits the PDU carrying the compression identifier for indicating the first compression buffer to a base station; and in case that the data transmitting terminal is a base station, the base station transmits the PDU carrying the compression identifier for indicating the first compression buffer to a UE.

Figures 2, 3:
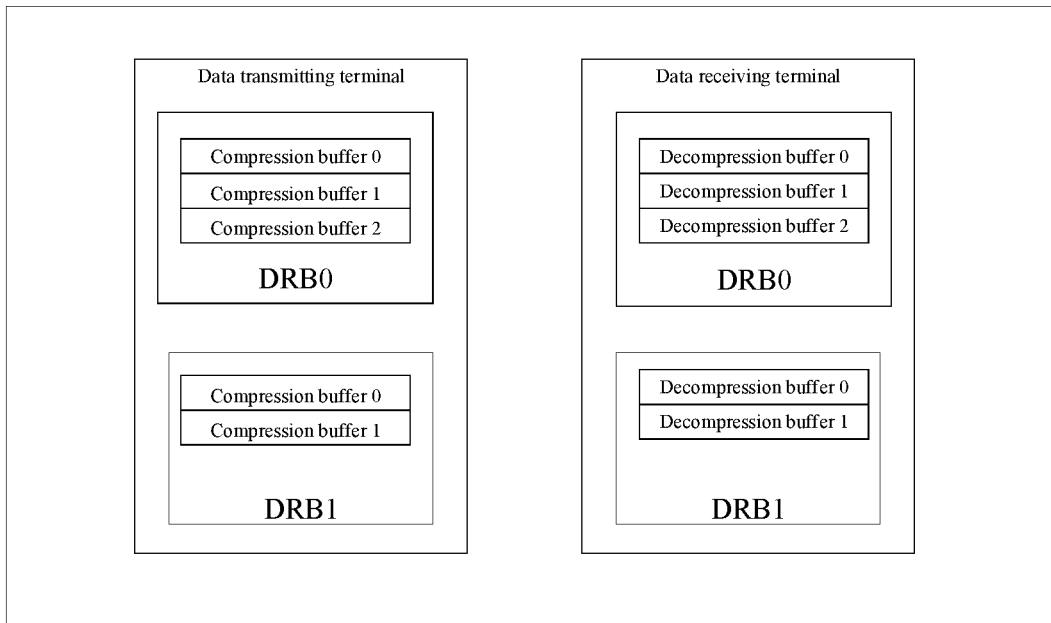
FIG. 2 is a schematic diagram of a compression buffer according to an embodiment of the present application.
FIG. 3 is a schematic diagram showing a flag of a compression buffer according to an embodiment of the present application.

In an exemplary scenario, as shown in FIG. 2, it includes a data transmitting terminal and a data receiving terminal. The compression process of data compression between the data transmitting terminal and the data receiving terminal can be as follows.

Two data radio bearers (DRB), including DRB0 and DRB1, are established in the data transmitting terminal and the data receiving terminal respectively. DRB0 bears three services, which respectively corresponds to compression buffer 0, compression buffer 1 and compression buffer 2 of the DRB0. DRB1 carries two services, which respectively corresponds to compression buffer 0 and compression buffer 1 of DRB1.

Step 1, in case the data transmitting terminal transmits a packet of service 0 of DRB0, the data transmitting terminal finds the compression buffer 0 of DRB0 according to a corresponding relationship between the service and the compression buffer, compresses the packet of service 0 using a dictionary in the compression buffer 0 of DRB0, packages the compressed packet into packet data convergence protocol (PDCP) protocol data unit (PDU), and adds a domain relating compression in the PDCP header, where the domain includes a compression buffer identifier or a compression dictionary identifier or an identifier of service 0, and then PDCP PDU is transmitted to a radio link control (RLC) layer.

Step 2, the RLC layer, medium access control (MAC) and a physical layer transmit the compressed packet.

Step 3, the RLC layer of the data receiving terminal resolves the PDCP PDU, and maps the compressed packet to DRB0 according to a channel mapping relationship and delivers the compressed packet to PDCP layer.

Step 4, the PDCP layer of the data receiving terminal finds the decompression buffer 0 of DRB0 according to the compression buffer identifier or compression dictionary identifier in the PDCP header, decompresses the data package using the decompression buffer 0 of DRB0, and updates dictionary information in the decompression buffer 0 of DRB0.

Step 5, the PDCP layer of the data receiving terminal delivers the decompressed packet to a higher layer.

In an embodiment, the higher layer can be a radio resource control (RRC) layer, a non-access-stratum (NAS) layer, a service data adaptation protocol (SDAP) layer, etc.

Figures 4, 5:
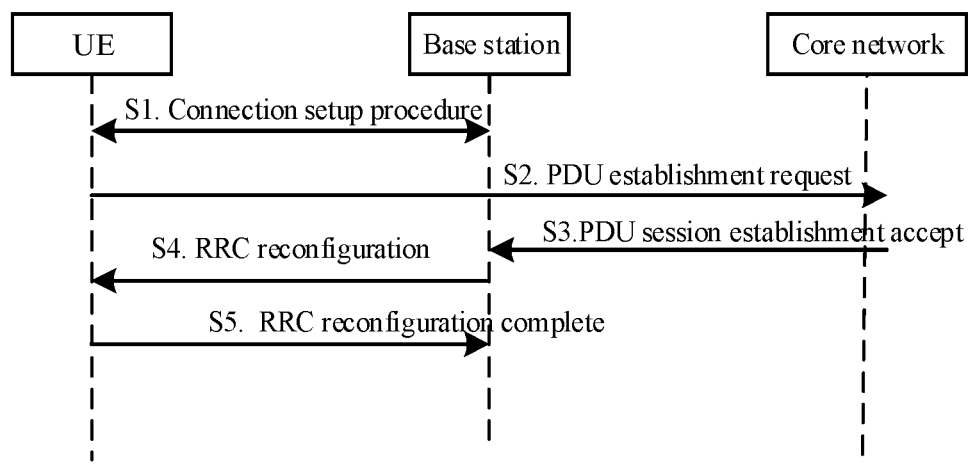
FIG. 4 is a schematic diagram showing another flag of a compression buffer according to an embodiment of the present application.
FIG. 5 is a schematic diagram showing an information interaction for configuring compression information according to an embodiment of the present application.

In an embodiment, in addition to the compression buffer identifier or compression dictionary identifier or service identifier, the PDCP header can include other identifiers. For example, as shown in FIG. 3 or FIG. 4, the PDCP header can further include domains included in a traditional PDCP header, such as serial number (SN), flag of UDC (FU), flag of reset (FR), checksum, etc. In an embodiment, FU indicates whether a packet is compressed by UDC protocol, and value "1" indicates that the packet is compressed by UDC protocol; FR indicates whether to reset the UDC compression buffer, and value "1" indicates that this is a first compressed packet after the UDC buffer reset; and checksum refers to that this filed contains validation bits for a compression buffer content: the checksum is calculated by a content of current compression buffer before a current packet is put into buffer.

The above steps 1-5 are performed on each packet to be transmitted, and the dictionary in the compression buffer corresponding to the service is used for compression and decompression to complete the compression and transmission of the data block.

It can be seen from the above embodiments that by determining the first compression buffer corresponding to the service to which the first data block to be transmitted belongs, compressing the first data block using the dictionary corresponding to the first compression buffer to obtain the compressed second data block, packaging the second data block into the PDU and adding the compression identifier for indicating the first compression buffer in the PDU header, and transmitting the PDU carrying the compression identifier to the data receiving terminal, the efficiency of data compression is improved and multiple services can be efficiently transmitted.

In an embodiment, the PDU in S103 can be a PDCP PDU. In case the compression identifier indicating the first compression buffer is added in the PDU in S103, it can be performed by, but is not limited to, the following ways.

S1031, the compression identifier for indicating the first compression buffer corresponding to the service to which the first data block belongs is added to the PDCP header of the PDCP PDU.

In an embodiment, the compression identifier indicating the first compression buffer can include one or more of the following items:
a compression buffer identifier of the first compression buffer;
a dictionary identifier corresponding to the first compression buffer;
a service identifier corresponding to the first compression buffer.

It can be seen from the above embodiments that the reliability of compression identifier transmission can be improved by adding the compression identifier for indicating the first compression buffer corresponding to the service to which the first data block belongs in the PDCP header of the PDCP PDU.

In an embodiment, in case that S1031 is performed, it can be implemented by, but is not limited to, the following ways:
determining a setting field for carrying the compression identifier in the PDCP header; and
adding the compression identifier in the setting field.

In an embodiment, the setting field can be a reserve field in the PDCP header, such as a position where buffer identity (buffer ID) is located shown in FIG. 3; or the setting field can be a newly added field in the PDCP header, such as a position where buffer ID is located shown in FIG. 4. It should be noted that FIG. 3 and FIG. 4 are only examples and do not constitute a limitation on the embodiments of the present application, and the setting field in the embodiments of the present application can be located at, but is not limited to, the positions of the buffer ID shown in FIG. 3 or FIG. 4.

In an embodiment, as shown in FIG. 3, a reserve bit is directly used to carry the buffer ID, and as shown in FIG. 4, a new byte is added in the PDCP header to carry the buffer ID. For example, the fields included in FIG. 3 or FIG. 4 are:
a data/control (D/C) field;
a reserve (R) field;
a serial number (SN) field;
a flag of UDC (FU) field;
a flag of reset (FR) field;
a buffer identity (Buffer ID) field;
a checksum field;
an oct field.

In an embodiment, the compression identifier can be set at the position of the buffer ID field shown in FIG. 3 or FIG. 4.

In an embodiment, the compression identifier added in the setting field can include one or more of the following items:
a compression buffer identifier of the first compression buffer;
a dictionary identifier corresponding to the first compression buffer;
a service identifier corresponding to the first compression buffer.

It can be seen from the above embodiments that the flexibility and diversity of compression identifier transmission are improved by adding compression identifier in the setting field of the PDCP header of the PDCP PDU.

In an embodiment, in S103, the compression identifier for indicating the first compression buffer corresponding to the service to which the first data block belongs can include one or more of the following items:
a compression buffer identifier of the first compression buffer corresponding to the service to which the first data block belongs;
a dictionary identifier corresponding to the first compression buffer corresponding to the service to which the first data block belongs;
a service identifier corresponding to the first compression buffer corresponding to the service to which the first data block belongs.

For example, the compression identifier for indicating the first compression buffer corresponding to the service to which the first data block belongs can include:
- a compression buffer identifier of the first compression buffer corresponding to the service to which the first data block belongs; or
- a dictionary identifier corresponding to the first compression buffer corresponding to the service to which the first data block belongs; or
- a service identifier corresponding to the first compression buffer corresponding to the service to which the first data block belongs.

For another example, the compression identifier indicating the first compression buffer corresponding to the service to which the first data block belongs can include:
- a compression buffer identifier of the first compression buffer corresponding to the service to which the first data block belongs and the dictionary identifier corresponding to the first compression buffer corresponding to the service to which the first data block belongs; or
- a compression buffer identifier of the first compression buffer corresponding to the service to which the first data block belongs and the service identifier corresponding to the first compression buffer corresponding to the service to which the first data block belongs; or
- a dictionary identifier corresponding to the first compression buffer corresponding to the service to which the first data block belongs and the service identifier corresponding to the first compression buffer corresponding to the service to which the first data block belongs.

For still another example, the compression identifier indicating the first compression buffer corresponding to the service to which the first data block belongs can include:
- a compression buffer identifier of the first compression buffer corresponding to the service to which the first data block belongs;
- a dictionary identifier corresponding to the first compression buffer corresponding to the service to which the first data block belongs;
- a service identifier corresponding to the first compression buffer corresponding to the service to which the first data block belongs.

In an embodiment, the method for compressing the data block can further include:
- S105, receiving a first message transmitted by a network device, where the first message includes compression information configured by the network device for a service to be compressed; and
- S106, establishing a compression buffer corresponding to the service to be compressed according to the compression information.

For example, in case the data receiving terminal receives the compression information configured by the network device for the service to be compressed, the data receiving terminal can establish the compression buffer corresponding to the service to be compressed according to the compression information and load corresponding dictionary into the compression buffer. In an embodiment, in case that the data transmitting terminal is a UE and the data receiving terminal is a base station, the network device can be a base station.

In an embodiment, the above S105 and S106 can be performed before S101 to establish compression buffer corresponding to each service to be compressed in advance, and then the first compression buffer corresponding to the service to which the first data block to be transmitted belongs can be determined in step S101.

In an exemplary scenario, as shown in FIG. 5, it includes a UE, a base station and a core network. For example, the configuration process of compression information between the base station and the core network includes the following steps.

S1, a radio resource control (RRC) connection is set up between the UE and the base station if the UE is not in a connection mode and the step is skipped if the UE maintains RRC connection.

S2, the UE initiates a protocol data unit (PDU) establishment request to the core network, where the request includes a service information, such as a quality of service (QOS) information.

S3, the core network determines to establish the PDU connection for the UE, establishes a connection between the base station and the core network for the UE, transmits a PDU session (session control) establishment accept message to the base station, and informs the base station the corresponding service information, such as QoS information.

S4, the base station configures information, such as radio bearer information, etc., for the UE, where the radio bearer information includes the compression information corresponding to the service, and transmits the information to the UE through a control plane message (such as RRC reconfiguration message). The compression information can include one or more of the following items:
- (1) a compression buffer identifier and/or a decompression buffer identifier;
- (2) a dictionary identifier;
- (3) compression buffer information and/or decompression buffer information (such as a buffer size);
- (4) a service identifier.

S5, after the UE receives the configuration information, the UE establishes a compression buffer for the corresponding service according to the compression information in the configuration information, loads corresponding dictionary into the compression buffer, and feeds back a RRC configuration complete message to the base station.

The configuration of multiple services can be performed by repeating S2 to S5. The base station configures the radio bearer according to the service properties, and can map multiple services to the same or different radio bearers. The multiple services can run at the same time, each service will initiate its own PDU session establishment process, and then the base station configures the services to appropriate RB using RRC reconfiguration.

It can be seen from the above embodiments that by receiving the first message transmitted by the network device, where the first message includes the compression information configured by the network device for the service to be compressed, establishing the compression buffer corresponding to the service to be compressed according to the compression information, and loading the corresponding dictionary into the compression buffer, which facilitates compressing by directly using the dictionary in the compression buffer in the subsequent process and improves the efficiency of data compression.

In an embodiment, in S105, the compression information configured by the network device for the service to be compressed can include one or more of the following items:
- a, a compression buffer identifier and/or a decompression buffer identifier;
- b, a dictionary identifier;
- c, compression buffer information and/or decompression buffer information (such as buffer size);
- d, a service identifier.

In an embodiment, the compression information configured by the network device for the service to be compressed can include twelve cases as follows.

In a first case, the compression information can include:
a, a compression buffer identifier and/or a decompression buffer identifier; or
b, a dictionary identifier; or
c, compression buffer information and/or a decompression buffer information; or
d, a service identifier.

In a second case, the compression information can include:
a, a compression buffer identifier and/or a decompression buffer identifier; and
b, a dictionary identifier.

In a third case, the compression information can include:
a, a compression buffer identifier and/or a decompression buffer identifier; and
c, compression buffer information and/or decompression buffer information.

In a fourth case, the compression information can include:
a, a compression buffer identifier and/or a decompression buffer identifier; and
d, a service identifier.

In a fifth case, the compression information can include:
b, a dictionary identifier; and
c, compression buffer information and/or decompression buffer information.

In a sixth case, the compression information can include:
b, a dictionary identifier; and
d, a service identifier.

In a seventh case, the compression information can include:
c, compression buffer information and/or decompression buffer information; and
d, a service identifier.

In an eighth case, the compression information can include:
a, a compression buffer identifier and/or a decompression buffer identifier; and
b, a dictionary identifier; and
c, compression buffer information and/or decompression buffer information.

In a ninth case, the compression information can include:
a, a compression buffer identifier and/or a decompression buffer identifier; and
b, a dictionary identifier; and
d, a service identifier.

In a tenth case, the compression information can include:
a, a compression buffer identifier, a decompression buffer identifier, a compression buffer identifier and a decompression buffer identifier; and
c, compression buffer information and/or decompression buffer information; and
d, a service identifier.

In an eleventh case, the compression information can include:
b, a dictionary identifier; and
c, compression buffer information and/or decompression buffer information; and
d, a service identifier.

In a twelfth case, the compression information can include:
a, a compression buffer identifier and/or a decompression buffer identifier; and
b, a dictionary identifier; and
c, compression buffer information and/or decompression buffer information; and
d, a service identifier.

In addition, the buffer size in the above compression buffer information and/or decompression buffer information can refer to the amount of dictionary information can be stored in the buffer. The transmitting terminal and the receiving side compress and decompress the data block using the dictionary in the buffer, where the larger the dictionary, the higher the compression rate.

In an embodiment, the method for compressing the data block can further include:

S107, receiving a second message transmitted by the network device, where the second message includes release information configured by the network device for a service to be released; and S108, releasing a compression buffer corresponding to the service to be released according to the release information.

For example, in case that the data receiving terminal receives the release information configured for the service to be released and transmitted by the network device, the data receiving terminal can release the compression buffer corresponding to the service to be released according to the release information. In case that the data transmitting terminal is a UE, the network device can be a base station.

In an embodiment, the above S107 and S108 can be performed before S101 or after S104.

Figure 6:
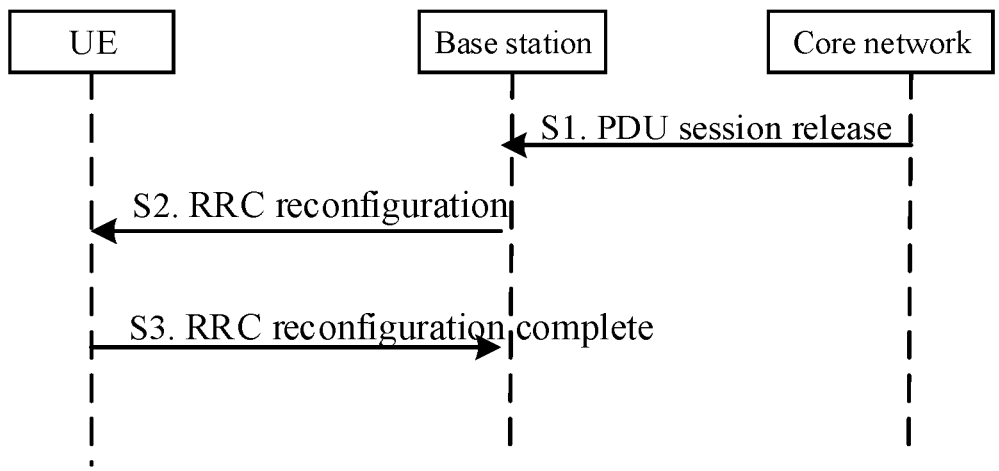
FIG. 6 is a schematic diagram showing an information interaction for releasing compression buffer according to an embodiment of the present application.

In an exemplary scenario, as shown in FIG. 6, it includes a UE, a base station, and a core network. For example, the release process of the compression buffer between the UE, base station and core network includes the following steps.

S1, the core network determines to release a PDU connection with a service of the terminal, transmits a PDU session release message to the base station, and informs the base station the corresponding service information (such as QoS information).

S2, the base station re-configures information, such as radio bearer information, etc., for the UE, where the radio bearer information includes the compression buffer identifier or compression dictionary identifier corresponding to the service to be released (for example, the compression buffer 2 of DRB0 in FIG. 2 is released), and transmits the information to the UE through a RRC reconfiguration message.

S3, after receiving the configuration information, the UE releases the compression buffer corresponding to the service according to the configuration information, for example, compression buffer 2 of DRB0 in FIG. 2 is released, and feeds back a configuration complete message to the base station.

Figure 7:
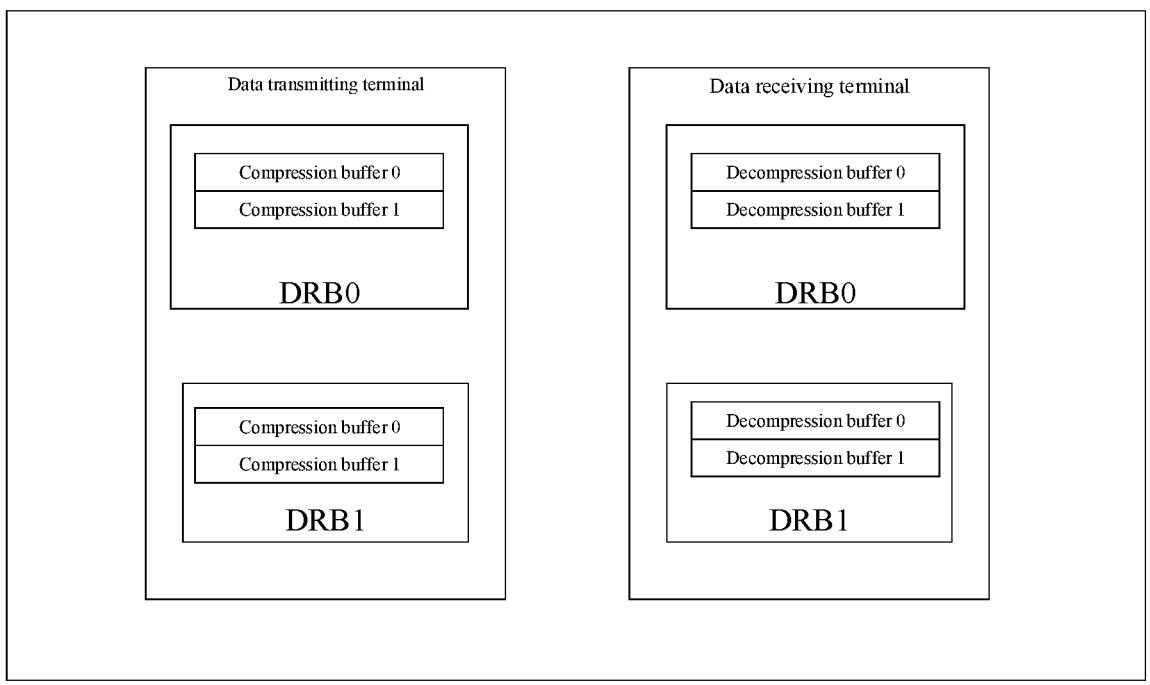
FIG. 7 is a schematic diagram of releasing compression buffer according to an embodiment of the present application.

For example, the bearer and compression buffer configuration of the data transmitting terminal before the release is shown in FIG. 2. After the compression buffer 2 of DRB0 in FIG. 2 is released, the bearer and compression buffer configuration of the transmitting terminal is shown in FIG. 7.

It can be seen from the above embodiments that by receiving the second message transmitted by the network device, where the second message includes the release information configured by the network device for the service to be released, and releasing the compression buffer corresponding to the service to be released according to the release information, resource waste can be avoided and resource utilization can be improved.

In an embodiment, in S107, the release information configured by the network device for the service to be released includes one or more of the following items:

a, a compression buffer identifier and/or a decompression buffer identifier;

b, a dictionary identifier;

c, a service identifier.

For example, the release information configured by the network device for the service to be released includes seven cases as follows.

In a first case, the release information includes:

a, a compression buffer identifier and/or a decompression buffer identifier.

In a second case, the release information includes:

b, a dictionary identifier.

In a third case, the release information includes:

c, a service identifier.

In a fourth case, the release information includes:

a, a compression buffer identifier and/or a decompression buffer identifier; and b, a dictionary identifier.

In a fifth case, the release information includes:

b, a dictionary identifier; and c, a service identifier.

In a sixth case, the release information includes:

a, a compression buffer identifier and/or a decompression buffer identifier; and c, a service identifier.

In a seventh case, the release information includes:

a, a compression buffer identifier and/or a decompression buffer identifier; and b, a dictionary identifier; and c, a service identifier.

In an embodiment, the method for compressing the data block can further include:

S109, updating a content of the dictionary corresponding to the first compression buffer corresponding to the service to which the first data block belongs with the first data block.

In an embodiment, the first data block is the uncompressed data block.

For example, updating the content of the dictionary means updating the dictionary information after each compression and updating the dictionary corresponding to the buffer according to the first data block. In an embodiment, the update method can be to replace old data block with new data block by directly using the first in first out method.

It can be seen from the above embodiments that the data transmitting terminal can carry multiple services on a radio bearer and each service corresponds to a compression buffer, and by determining the first compression buffer corresponding to the service to which the first data block to be transmitted belongs, compressing the first data block using the dictionary corresponding to the first compression buffer to obtain the compressed second data block, packaging the second data block into the PDU and adding the compression identifier for indicating the first compression buffer in the PDU header, and transmitting the PDU carrying the compression identifier to the data receiving terminal, efficiency of data compression is improved and the multiple services are efficiently transmitted.

Figure 8:
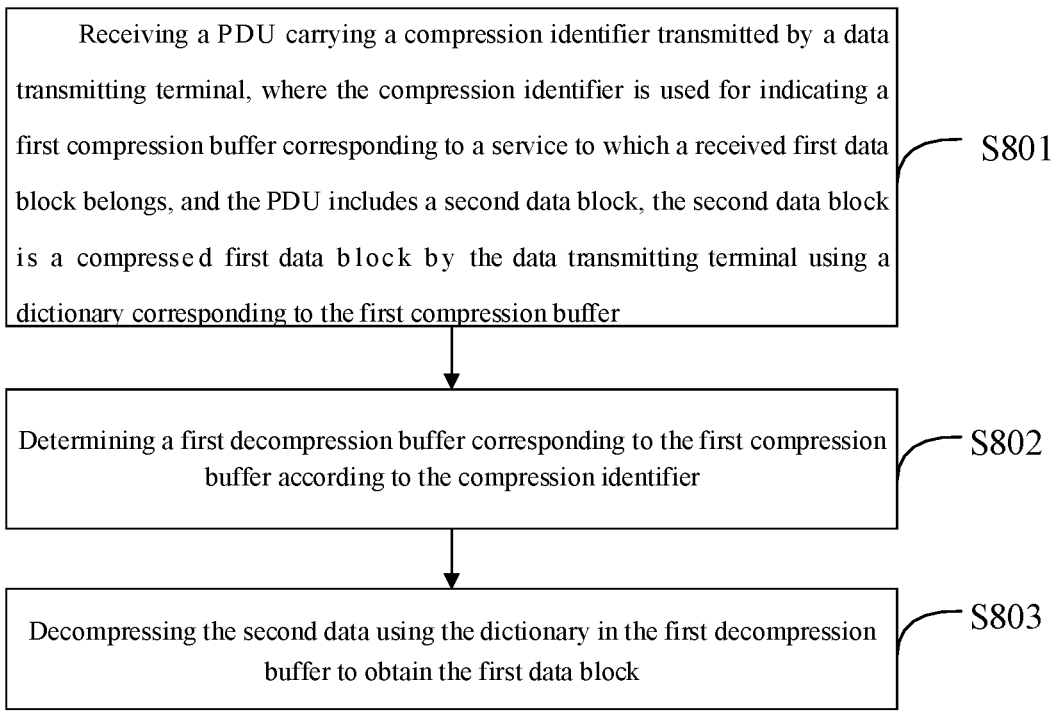
FIG. 8 is a schematic flowchart diagram of a method for compressing a data block according to an embodiment of the present application.

FIG. 8 is a schematic flowchart diagram of a method for compressing a data block according to an embodiment of the present application. The method is performed by a data receiving terminal. The data receiving terminal can receive multiple compressed services carried on a radio bearer, where each service corresponds to a decompression buffer. As shown in FIG. 8, the method for compressing the data block can include the following steps.

S801, receiving a protocol data unit (PDU) carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer.

For example, the data receiving terminal receives the PDU carrying the compression identifier transmitted by the data transmitting terminal, where the compression identifier is used for indicating the first compression buffer corresponding to the service to which the received first data block belongs, and the PDU carrying the compression identifier transmitted by the data transmitting terminal includes the second data block, the second data block is a compressed first data block by the data transmitting terminal using the dictionary corresponding to the first compression buffer corresponding to the service to which the first data block belongs. The data receiving terminal here can be a base station or a user equipment (UE).

For example, a base station receives the PDU carrying the compression identifier transmitted by a user equipment, where the compression identifier is used for indicating the first compression buffer corresponding to the service to which the received first data block belongs, and the PDU carrying the compression identifier transmitted by the UE includes the second data block, the second data block is a compressed first data block by the UE using the dictionary corresponding to the first compression buffer corresponding to the service to which the first data block belongs.

For another example, a UE receives the PDU carrying the compression identifier transmitted by a base station, where the compression identifier is used for indicating the first compression buffer corresponding to the service to which the received first data block belongs, and the PDU carrying the compression identifier transmitted by the base station includes the second data block, the second data block is a compressed first data block by the base station using the dictionary corresponding to the first compression buffer corresponding to the service to which the first data block belongs.

S802, determining a first decompression buffer corresponding to the first compression buffer according to the compression identifier.

For example, the data receiving terminal determines the first decompression buffer corresponding to the first compression buffer corresponding to the service to which the first data block belongs according to the compression identifier. The data receiving terminal here can be a base station or a UE.

For example, a base station determines the first decompression buffer corresponding to the first compression buffer corresponding to the service to which the first data block belongs according to the compression identifier; or the UE determines the first decompression buffer corresponding to the first compression buffer corresponding to the service to which the first data block belongs according to the compression identifier.

S803, decompressing the second data block using the dictionary in the first decompression buffer to obtain the first data block.

For example, the data receiving terminal decompresses the second data block using the dictionary in the first decompression buffer corresponding to the service to which the first data block belongs, to obtain the first data block received by the receiving side, where the second data block is the compressed first data block received by the receiving terminal. The data receiving terminal here can be a base station or a UE.

For example, a base station decompresses the second data block using the dictionary in the first decompression buffer corresponding to the service to which the first data block belongs to obtain the first data block received by the base station, where the second data block is the compressed first data block received by the base station; or
- a UE decompresses the second data block using the dictionary in the first decompression buffer corresponding to the service to which the first data block belongs to obtain the first data block received by the UE, where the second data block is the compressed first data block received by the UE.

In an embodiment, in an exemplary scenario, as shown in FIG. 2, it includes a data transmitting terminal and a data receiving terminal. The compression process of data compression between the data transmitting terminal and the data receiving terminal is not repeated here.

It can be seen from the above embodiments that by receiving the setting message carrying the compression identifier transmitted by the data transmitting terminal, where the compression identifier is used for indicating the first compression buffer corresponding to the service to which the received first data block belongs and the setting message includes the second data block, the second data block is the compressed first data block by the data transmitting terminal using the dictionary corresponding to the first compression buffer, determining the first decompression buffer corresponding to the first compression buffer according to the compression identifier, and decompressing the second data block using the dictionary in the first decompression buffer to obtain the first data block, the efficiency of data compression is improved and multiple services is efficiently transmitted.

In an embodiment, the PDU in S801 can be a PDCP PDU and a PDCP header of the PDCP PDU includes the compression identifier for indicating the first compression buffer corresponding to the service to which the received first data block belongs.

In an embodiment, the compression identifier of the first compression buffer can include one or more of the following items:
- a compression buffer identifier of the first compression buffer;
- a dictionary identifier corresponding to the first compression buffer;
- a service identifier corresponding to the first compression buffer.
- when performing S201, the data receiving terminal can obtain the compression identifier from the PDCP header of the PDCP PDU after receiving the PDCP PDU.

It can be seen from the above embodiments that the reliability of compression identifier transmission can be improved by obtaining the compression identifier from the PDCP header of the PDCP PDU after receiving the PDCP PDU.

In an embodiment, the PDU in S801 can be PDCP PDU and a setting field of the PDCP header of the PDCP PDU includes the compression information for indicating the first compression buffer corresponding to the service to which the received first data block belongs.

When performing S201, the data receiving terminal can obtain the compression identifier from the setting field of the PDCP header of the PDCP PDU after receiving the PDCP PDU.

In an embodiment, the setting field can be a reserve field in the PDCP header, such as a position where buffer identity (buffer ID) is located shown in FIG. 3; or the setting field can be a new field in the PDCP header, such as a position where buffer ID is located shown in FIG. 4.

In an embodiment, the compression identifier can be set at the position of the buffer ID field shown in FIG. 3 or FIG. 4.

In an embodiment, the compression identifier added in the setting field can include one or more of the following items:
- a compression buffer identifier of the first compression buffer;
- a dictionary identifier corresponding to the first compression buffer;
- a service identifier corresponding to the first compression buffer.

It can be seen from the above embodiments that the flexibility and diversity of obtaining the compression identifier are improved by obtaining the compression identifier from the setting field of the PDCP header of the PDCP PDU after receiving the PDCP PDU.

In an embodiment, in S801, the compression identifier for indicating the first compression buffer corresponding to the service to which the first data block belongs can include one or more of the following items:
- a compression buffer identifier of the first compression buffer corresponding to the service to which the first data block belongs;
- a dictionary identifier corresponding to the first compression buffer corresponding to the service to which the first data block belongs;
- a service identifier corresponding to the first compression buffer corresponding to the service to which the first data block belongs.

For example, the compression identifier for indicating the first compression buffer corresponding to the service to which the first data block belongs can include:
- a compression buffer identifier of the first compression buffer corresponding to the service to which the first data block belongs; or
- a dictionary identifier corresponding to the first compression buffer corresponding to the service to which the first data block belongs; or
- a service identifier corresponding to the first compression buffer corresponding to the service to which the first data block belongs.

For another example, the compression identifier for indicating the first compression buffer corresponding to the service to which the first data block belongs can include:
- a compression buffer identifier of the first compression buffer corresponding to the service to which the first data block belongs and the dictionary identifier corresponding to the first compression buffer corresponding to the service to which the first data block belongs; or
- a compression buffer identifier of the first compression buffer corresponding to the service to which the first data block belongs and the service identifier corresponding to the first compression buffer corresponding to the service to which the first data block belongs; or
- a dictionary identifier corresponding to the first compression buffer corresponding to the service to which the first data block belongs and the service identifier corresponding to the first compression buffer corresponding to the service to which the first data block belongs.

For still another example, the compression for identifier indicating the first compression buffer corresponding to the service to which the first data block belongs can include:
- a compression buffer identifier of the first compression buffer corresponding to the service to which the first data block belongs;
- a dictionary identifier corresponding to the first compression buffer corresponding to the service to which the first data block belongs;
- a service identifier corresponding to the first compression buffer corresponding to the service to which the first data block belongs.

In an embodiment, the method for compressing the data block can further include:
- S804, receiving a first message transmitted by network device, where the first message includes compression information configured by the network device for a service to be compressed; and
- S805, establishing a decompression buffer corresponding to the service to be compressed according to the compression information.

For example, in case the data receiving terminal receives the compression information configured by the network device for the service to be compressed, the data receiving terminal can establish the decompression buffer corresponding to the service to be compressed according to the compression information and load corresponding dictionary into the decompression buffer. In an embodiment, in case the data transmitting terminal is a terminal and the data receiving terminal is a base station, the network device can be a base station.

In an embodiment, S804 and S805 can be performed before S801.

In an exemplary scenario, as shown in FIG. 5, it includes a user equipment, a base station and a core network. For example, the configuration process of compression information between the base station and the core network includes not only S1 to S5 shown in FIG. 5, but also:
- the base station establishes the decompression buffer corresponding to the service to be compressed according to the compression information, and loads the corresponding dictionary into the decompression buffer.

It can be seen from the above embodiments that by receiving the first message transmitted by the network device, where the first message includes the compression information configured by the network device for the service to be compressed, establishing the corresponding decompression buffer for the service to be compressed according to the compression information, and loading the corresponding dictionary into the decompression buffer, which facilitates decompressing by directly using the dictionary in the decompression buffer in the subsequent process, improves the efficiency of data decompression and meets the requirements of data decompression with multiple services.

In an embodiment, in S804, the compression information configured by the network device for the service to be compressed can include one or more of the following items:
a, a compression buffer identifier and/or a decompression buffer identifier;
b, a dictionary identifier;
c, compression buffer information and/or decompression buffer information;
d, a service identifier.

In an embodiment, the method for compressing the data block can further include:
- S806, receiving a second message transmitted by the network device, where the second message includes release information configured by the network device for a service to be released; and
- S807, releasing a decompression buffer corresponding to the service to be released according to the release information.

For example, in case the data receiving terminal receives the second message transmitted by the network device, where the second message includes release information configured by the network device for the service to be released, the data receiving terminal can release the decompression buffer corresponding to the service to be released according to the release information. In case the data transmitting terminal is a user equipment and the data receiving terminal is a base station, the network device can be a base station.

In an embodiment, S806 and S807 can be performed before S801 or after S803.

In an exemplary scenario, as shown in FIG. 6, it includes a user equipment, a base station and a core network. In an embodiment, the release process of the compression buffer between the UE, the base station and the core network further includes the following step in addition to S1 to S3 shown in FIG. 6:
- the base station releases the decompression buffer corresponding to the service to be released according to the release information. For example, the decompression buffer 2 of DRB0 in FIG. 2 is released.

For example, the bearer and decompression buffer configuration of the data receiving terminal before the release is shown in FIG. 2. After the decompression buffer 2 of DRB0 in FIG. 2 is released, the bearer and decompression buffer configuration of the data receiving terminal is shown in FIG. 7.

In an embodiment, in S806, the release information configured by the network device for the service to be released includes one or more of the following items:
a, a compression buffer identifier and/or a decompression buffer identifier;
b, a dictionary identifier;
c, a service identifier.

In an embodiment, the method for compressing the data block can further include:
- S808, updating a content of the dictionary in the first decompression buffer corresponding to the service to which the first data block belongs with the first data block.

In an embodiment, the first data block is the decompressed data block.

For example, updating the dictionary content means updating the dictionary information after each decompression and updating the dictionary corresponding to the buffer according to the first data block. In an embodiment, the update method is to replace old data block with new data block by directly using the first in first out method.

It can be seen from the above embodiments that the data receiving terminal can carry multiple services on a radio bearer and each service corresponds to a compression buffer, and by determining the first compression buffer corresponding to the service to which the first data block to be transmitted belongs, compressing the first data block using the dictionary corresponding to the first compression buffer to obtain the compressed second data block, packaging the second data block into the PDU and adding the compression identifier for indicating the first compression buffer in the PDU header, and transmitting the PDU carrying the compression identifier to the data receiving terminal, efficiency of data compression is improved and the multiple services are efficiently transmitted.

Figure 9:
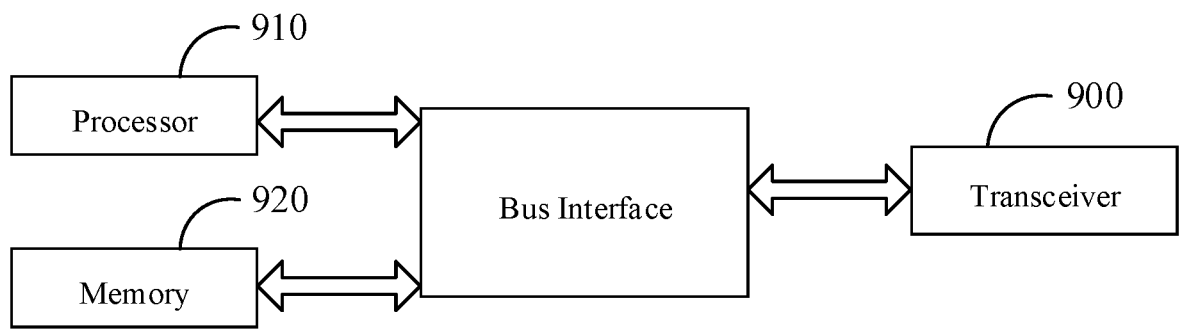
FIG. 9 is a schematic structural diagram of an apparatus for compressing a data block according to an embodiment of the present application.

FIG. 9 is a schematic structural diagram of an apparatus for compressing a data block according to an embodiment of the present application. The apparatus for compressing a data block can carry multiple services on a radio bearer and each service corresponds to a compression buffer. The apparatus includes a memory 920, a transceiver 900, and a processor 910.

In FIG. 9, the bus architecture can include any number of interconnected buses and bridges. In an embodiment, various circuits of one or more processors represented by processor 910 and memory represented by memory 920 are linked together. The bus architecture can further link various other circuits such as peripheral devices, voltage regulators, power management circuits, etc. The bus interface provides interfaces. The transceiver 900 can be multiple components, that is, including a transmitter and a receiver and providing units for communicating with various other devices on a transmission medium, where the transmission medium includes a wireless channel, a wired channel, an optical cable and other transmission medium. The processor 910 can be used for the management of the bus architecture and general process. The memory 920 can store data used by the processor 910 when the processor 910 performs operations.

The processor 910 can be a central processing unit (CPU), an application specific integrated circuit (ASIC), a field programmable gate array (FPGA) or a complex programmable logic device (CPLD), or the processor can be multi-core architecture.

The memory 920 is used for storing computer programs. The transceiver 900 is used for receiving and transmitting data block under the control of the processor. The processor 910 is used for reading the computer programs in the memory and performing the following operations:
 determining a first compression buffer corresponding to a service to which first data block to be transmitted belongs;
 compressing the first data block using a dictionary corresponding to the first compression buffer to obtain a compressed second data block;
 packaging the second data block into a protocol data unit (PDU) and adding a compression identifier for indicating the first compression buffer in a PDU header; and
 transmitting the PDU carrying the compression identifier to a data receiving terminal.

In an embodiment, in the apparatus for compressing a data block according to the embodiment of the present application, the PDU is a packet data convergence protocol (PDCP) PDU;
 the adding a compression identifier for indicating the first compression buffer in a PDU header includes:
 adding the compression identifier in a PDCP header of the PDCP PDU.

In an embodiment, in the apparatus for compressing a data block according to the embodiment of the present application, the adding the compression identifier in a PDCP header of the PDCP PDU includes:
 determining a setting field for carrying the compression identifier in the PDCP header; and
 adding the compression identifier in the setting field.

In an embodiment, in the apparatus for compressing a data block according to the embodiment of the present application, the compression identifier includes one or more of the following items:
 a compression buffer identifier of the first compression buffer;
 a dictionary identifier corresponding to the first compression buffer;
 a service identifier corresponding to the first compression buffer.

According to the apparatus for compressing a data block according to the embodiment of the present application, the processor 910 further performs the following operations:
 receiving a first message transmitted by a network device, where the first message includes compression information configured by the network device for a service to be compressed; and
 establishing a compression buffer corresponding to the service to be compressed according to the compression information.

In an embodiment, in the apparatus for compressing a data block according to the embodiment of the present application, the compression information includes one or more of the following items:
 a compression buffer identifier and/or a decompression buffer identifier;
 a dictionary identifier;
 compression buffer information and/or decompression buffer information;
 a service identifier.

In the apparatus for compressing a data block according to the embodiment of the present application, the processor 910 further performs the following operations:
 receiving a second message transmitted by the network device, where the second message includes release information configured by the network device for a service to be released; and
 releasing a compression buffer corresponding to the service to be released according to the release information.

In an embodiment, in the apparatus for compressing a data block according to the embodiment of the present application, the release information includes one or more of the following items:
 a compression buffer identifier and/or a decompression buffer identifier;
 a dictionary identifier;
 a service identifier.

In the apparatus for compressing a data block according to the embodiment of the present application, the processor 910 further performs the following operations:
 updating a content of the dictionary corresponding to the first compression buffer with the first data block.

It can be seen from the above embodiments that the apparatus for compressing the data block can carry multiple services on a radio bearer, where each service corresponds to a compression buffer, and by determining the first compression buffer corresponding to the service to which the first data block to be transmitted belongs, compressing the first data block using the dictionary corresponding to the first compression buffer to obtain the compressed second data block, packaging the second data block into the PDU and adding the compression identifier for indicating the first compression buffer in the PDU header, and transmitting the PDU carrying the compression identifier to the data receiving terminal, efficiency of data compression is improved and the multiple services are efficiently transmitted.

Figure 10:
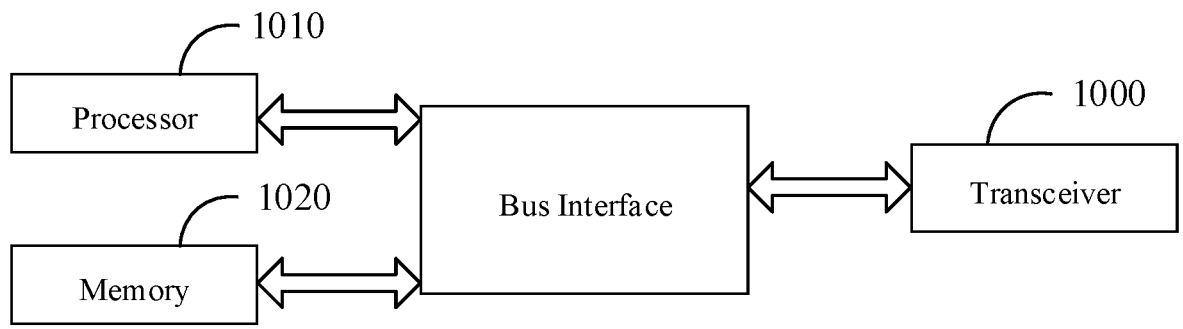
FIG. 10 is a schematic structural diagram of an apparatus for compressing a data block according to an embodiment of the present application.

FIG. 10 is a schematic structural diagram of an apparatus for compressing a data block according to an embodiment of the present application. The apparatus for compressing a data block can carry multiple services on a radio bearer and each service corresponds to a compression buffer. The apparatus includes a memory 1020, a transceiver 1000, and a processor 1010.

In FIG. 10, the bus architecture can include any number of interconnected buses and bridges. In an embodiment, various circuits of one or more processors represented by the processor 1010 and memory represented by the memory 1020 are linked together. The bus architecture can further link various other circuits such as peripheral devices, voltage regulators, power management circuits, etc. The bus interface provides interfaces. The transceiver 1000 can be multiple components, that is, including a transmitter and a receiver and providing units for communicating with various other devices on a transmission medium, where the transmission medium includes a wireless channel, a wired channel, an optical cable and other transmission medium. The processor 1010 can be used for the management of the bus architecture and general process. The memory 1020 can store data used by the processor 1010 when the processor 1010 performs operations.

The processor 1010 can be a central processing unit (CPU), an application specific integrated circuit (ASIC), a field programmable gate array (FPGA) or a complex programmable logic device (CPLD), or the processor can be multi-core architecture.

The memory 1020 is used for storing computer programs. Transceiver 1000 is used for receiving and transmitting the data block under the control of the processor. Processor 1010 is used for reading the computer programs in the memory and performing the following operations:
receiving a protocol data unit (PDU) carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer;
determining a first decompression buffer corresponding to the first compression buffer according to the compression identifier; and
decompressing the second data block using a dictionary corresponding to the first decompression buffer to obtain the first data block.

In an embodiment, in the apparatus for compressing a data block according to the embodiment of the present application, the PDU is a packet data convergence protocol (PDCP) PDU; and
a PDCP header of the PDCP PDU includes the compression identifier.

In an embodiment, in the apparatus for compressing the data block according to the embodiment of the present application, a setting field for carrying the compression identifier in the PDCP header includes the compression identifier.

In an embodiment, in the apparatus for compressing the data block according to the embodiment of the present application, the compression identifier includes one or more of the following items:
a compression buffer identifier of the first compression buffer;
a dictionary identifier corresponding to the first compression buffer;
a service identifier corresponding to the first compression buffer.

In an embodiment, the apparatus for compressing the data block according to the embodiment of the present application, further including:
receiving a first message transmitted by network device, where the first message includes compression information configured by the network device for a service to be compressed; and
establishing a decompression buffer corresponding to the service to be compressed according to the compression information.

In an embodiment, in the apparatus for compressing the data block according to the embodiment of the present application, the compression information includes one or more of the following items:
a compression buffer identifier and/or a decompression buffer identifier;
a dictionary identifier;
compression buffer information and/or decompression buffer information;
a service identifier.

According to the apparatus for compressing the data block according to the embodiment of the present application, the processor 1010 further performs the following operations:
receiving a second message transmitted by the network device, where the second message includes release information configured by the network device for a service to be released; and
releasing a decompression buffer corresponding to the service to be released according to the release information.

In an embodiment, in the apparatus for compressing the data block according to the embodiment of the present application, the release information includes one or more of the following items:
a compression buffer identifier and/or a decompression buffer identifier;
a dictionary identifier;
a service identifier.

In the apparatus for compressing the data block according to the embodiment of the present application, the processor 1010 further performs the following operations:
updating a content of the dictionary corresponding to the first decompression buffer with the first data block.

It can be seen from the above embodiments that the apparatus for compressing the data block can receive multiple compressed services carried on a radio bearer, where each service corresponds to a compression buffer, and by receiving the PDU carrying the compression identifier transmitted by the data transmitting terminal, where the compression identifier is used for indicating the first compression buffer corresponding to the service to which the received first data block belongs and the PDU includes the second data block, the second data block is the compressed first data block by the data transmitting terminal using the dictionary corresponding to the first compression buffer, determining the first decompression buffer corresponding to the first compression buffer according to the compression identifier, and decompressing the second data block using the dictionary in the first decompression buffer to obtain the first data block, the efficiency of data compression is improved and multiple services are efficiently transmitted.

It should be noted here that the above apparatuses according to the embodiments of the present application can perform all the method steps implemented by the above method embodiments and can achieve the same effect. The same part and beneficial effect of the apparatus embodiments with the method embodiments are not be repeated in detail here.

Figure 11:
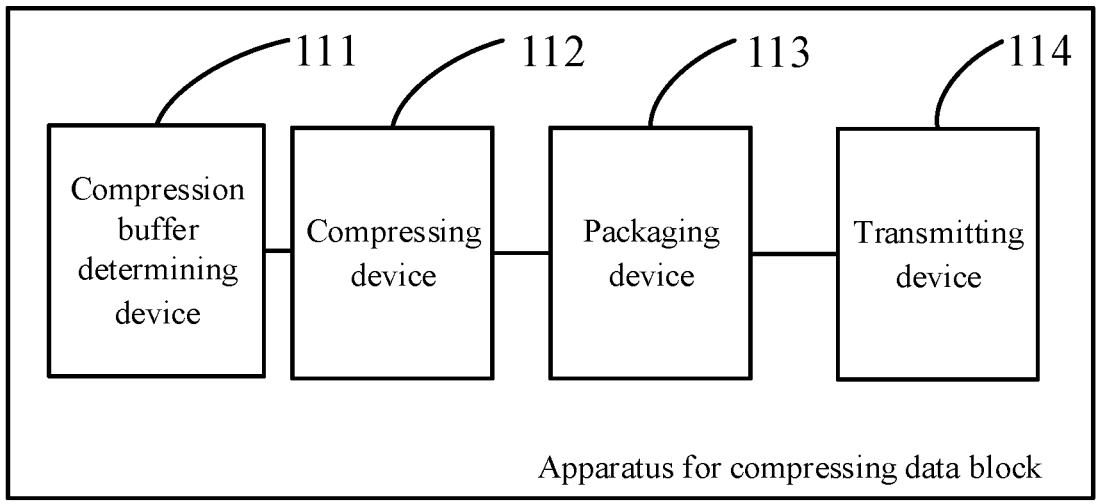
FIG. 11 is a schematic structural diagram of an apparatus for compressing a data block according to an embodiment of the present application.

FIG. 11 is a schematic structural diagram of an apparatus for compressing a data block according to an embodiment of the present application. The apparatus for compressing the data block is applied to a data transmitting terminal which can carry multiple services on a radio bearer, where each service corresponds to a compression buffer, and the apparatus includes:

a compression buffer determining device 111, configured to determine a first compression buffer corresponding to a service to which first data block to be transmitted belongs;

a compressing device 112, configured to compress the first data block using a dictionary corresponding to the first compression buffer to obtain compressed second data block;

a packaging device 113, configured to package the second data block into a protocol data unit (PDU) and add a compression identifier for indicating the first compression buffer in a PDU header; and a transmitting device 114, configured to transmit the PDU carrying the compression identifier to a data receiving terminal.

In an embodiment, based on the above apparatus, the PDU is a packet data convergence protocol (PDCP) PDU;

the adding a compression identifier for indicating the first compression buffer in a PDU header includes:

adding the compression identifier in a PDCP header of the PDCP PDU.

In an embodiment, based on the above apparatus, the adding the compression identifier in a PDCP header of the PDCP PDU includes:

determining a setting field for carrying the compression identifier in the PDCP header; and adding the compression identifier in the setting field.

In an embodiment, based on the above apparatus, the compression identifier includes one or more of the following items:

a compression buffer identifier of the first compression buffer;

a dictionary identifier corresponding to the first compression buffer;

a service identifier corresponding to the first compression buffer.

In an embodiment, based on the above apparatus, the apparatus further includes:

a first receiving device, configured to receive a first message transmitted by a network device, where the first message includes compression information configured by the network device for a service to be compressed; and an establishing device, configured to establish a compression buffer corresponding to the service to be compressed according to the compression information.

In an embodiment, based on the above apparatus, the compression information includes one or more of the following items:

a compression buffer identifier and/or a decompression buffer identifier;

a dictionary identifier;

compression buffer information and/or decompression buffer information;

a service identifier.

In an embodiment, based on the above apparatus, the apparatus further includes:

a second receiving device, configured to receive a second message transmitted by the network device, where the second message includes release information configured by the network device for a service to be released; and a releasing device, configured to release a compression buffer corresponding to the service to be released according to the release information.

In an embodiment, based on the above apparatus, the release information includes one or more of the following items:

a compression buffer identifier and/or a decompression buffer identifier;

a dictionary identifier;

a service identifier.

In an embodiment, based on the above apparatus, the apparatus further includes:

an updating device, configured to update a content of the dictionary corresponding to the first compression buffer with the first data block.

It can be seen from the above embodiments that the apparatus for compressing the data block is applied to a data transmitting terminal which can carry multiple services on a radio bearer, where each service corresponds to a compression buffer. The apparatus for compressing the data block includes a compression buffer determining device, configured to determine a first compression buffer corresponding to a service to which first data block to be transmitted belongs; a compressing device, configured to compress the first data block using a dictionary corresponding to the first compression buffer to obtain a compressed second data block; a packaging device, configured to package the second data block into a PDU and add a compression identifier for indicating the first compression buffer in the PDU header; and a transmitting device, configured to transmit the PDU carrying the compression identifier to a data receiving terminal. The embodiments of the present application improve the efficiency of data compression and can achieve efficient transmission of the multiple services.

Figure 12:
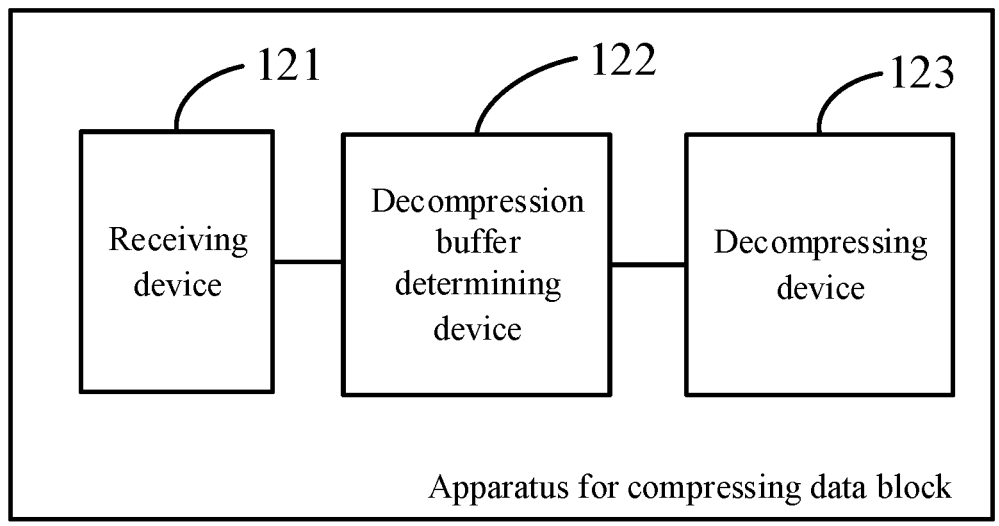
FIG. 12 is a schematic structural diagram of an apparatus for compressing a data block according to an embodiment of the present application.

FIG. 12 is a schematic structural diagram of an apparatus for compressing a data block according to an embodiment of the present application. The apparatus for compressing the data block is applied to a data receiving terminal which can receive multiple compressed services carried on a radio bearer, where each service corresponds to a decompression buffer. The apparatus includes:

a receiving device 121, configured to receive a PDU carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer;

a decompression buffer determining device 122, configured to determine a first decompression buffer corresponding to the first compression buffer according to the compression identifier; and a decompressing device 123, configured to decompress the second data block using a dictionary corresponding to the first decompression buffer to obtain the first data block.

In an embodiment, based on the above apparatus, the PDU is a packet data convergence protocol (PDCP) PDU; and PDCP header of the PDCP PDU includes the compression identifier.

In an embodiment, based on the above apparatus, a setting field for carrying the compression identifier in the PDCP header includes the compression identifier.

In an embodiment, based on the above apparatus, the compression identifier includes one or more of the following items:
  a compression buffer identifier of the first compression buffer;
  a dictionary identifier corresponding to the first compression buffer;
  a service identifier corresponding to the first compression buffer.

In an embodiment, based on the above apparatus, the receiving device 121 is further configured to:
  receive a first message transmitted by network device, where the first message includes compression information configured by the network device for a service to be compressed; and
  establish a decompression buffer corresponding to the service to be compressed according to the compression information In an embodiment, based on the above apparatus, the compression information includes one or more of the following items:
  a compression buffer identifier and/or a decompression buffer identifier;
  a dictionary identifier;
  compression buffer information and/or decompression buffer information;
  a service identifier.

In an embodiment, based on the above apparatus, the receiving device 121 is further configured to:
  receive a second message transmitted by the network device, where the second message includes release information configured by the network device for a service to be released; and
  release a decompression buffer corresponding to the service to be released according to the release information.

In an embodiment, based on the above apparatus, the release information includes one or more of the following items:
  a compression buffer identifier and/or a decompression buffer identifier;
  a dictionary identifier;
  a service identifier.

In an embodiment, based on the above apparatus, the apparatus further includes:
  a content updating device, configured to update a content of the dictionary corresponding to the first decompression buffer with the first data block.

It can be seen from the above embodiments that the apparatus for compressing the data block is applied to a data receiving terminal which is able to receive multiple compressed services carried on a radio bearer, where each service corresponds to a decompression buffer. The apparatus for compressing the data block includes a receiving device, configured to receive a PDU carrying a compression identifier transmitted by a data transmitting terminal, where the compression identifier is used for indicating a first compression buffer corresponding to a service to which a received first data block belongs, and the PDU includes a second data block, the second data block is a compressed first data block by the data transmitting terminal using a dictionary corresponding to the first compression buffer; a decompression buffer determining device, configured to determine a first decompression buffer corresponding to the first compression buffer according to the compression identifier; and a decompressing device, configured to decompress the second data block using a dictionary corresponding to the first decompression buffer to obtain the first data block. The embodiments of the present application improve the efficiency of data compression and the multiple services are efficiently transmitted.

It should be noted that the division of units in the embodiments of the present application is schematic, which is only a logical function division, and there can be another division method in the actual implementation. In addition, various functional units in various embodiments of the present application can be integrated in one processing unit, or can be physically independent units, or two or more units can be integrated in one unit. The above integrated unit can be implemented in the form of hardware or software functional unit.

When the integrated unit is implemented in the form of software functional unit and sold or used as an independent product, it can be stored in a processor readable storage medium. Based on such understanding, the solutions of the present application in essence or the part of the solutions that contributes to the related art or part of the solutions can be embodied in the form of a software product, and the computer software product is stored in a storage medium and includes several instructions to cause a computer device (which can be a personal computer, a server, or a network device or the like) or a processor to perform all or part of the steps of the methods described in the various embodiments of the present application. The foregoing storage medium includes: USB flash memory, removable hard disk, read-only memory (ROM), random access memory (RAM), magnetic disk or optical disk and other mediums that can store program codes.

It should be noted that the above apparatuses according to the embodiments of the present application can implement all the method steps implemented by the above method embodiments and can achieve the same effect. The same part and beneficial effect of the apparatus embodiments with the method embodiments are not be repeated in detail here.

An embodiment of the present application provides a processor readable storage medium, storing computer programs, where the computer programs, when executed by the processor, cause the processor to perform the method applied to the data transmitting terminal or the method applied to the data receiving terminal.

The processor readable storage medium can be any available medium or data storage device that can be accessed by the processor, including but not limited to magnetic memory (such as floppy disk, hard disk, magnetic tape, magneto-optical disk (MO), etc.), optical memory (such as CD, DVD, BD, HVD, etc.), and semiconductor memory (such as ROM, EPROM, EEPROM, non-volatile memory (NAND FLASH), solid state disk (SSD)), etc.

It can be seen from the above embodiments that the processor readable storage medium stores computer programs that enables the processor to perform the method for compressing the data block described above. The embodiments of the present application improve the efficiency of data compression and achieve efficient transmission of the multiple services.

Embodiments of the present application can be provided as method, system, or computer program product. The present application can adopt the form of a complete hardware embodiment, a complete software embodiment, or an embodiment combining software and hardware aspects. Furthermore, the present application can adopt the form of a computer program product implemented on one or more computer usable storage media (including but not limited to disk memory, optical memory, etc.) including computer usable program codes.

The present application is described with reference to the flow chart and/or block diagram of the method, apparatus, device (system), and computer program product according to the embodiments of the present application. It shall be understood that each flow and/or block in the flow chart and/or block diagram and the combination of flow and/or block in the flow chart and/or block diagram can be implemented by computer executable instructions. These computer executable instructions can be provided to a processor of a general purpose computer, a special purpose computer, an embedded processor or other programmable data processing device to generate a machine and instructions executed by a processor of a computer or other programmable data processing device generate a device for implementing functions specified in one or more flows in the flow charts and/or one or more blocks in the block diagrams.

These processor executable instructions can also be stored in a processor readable memory that can guide a computer or other programmable data processing device to operate in a specific way, and the instructions stored in the processor readable memory generate a manufacture including an instruction device that implements the functions specified in one or more flows in the flow charts and/or one or more blocks in the block diagrams.

These processor executable instructions can also be loaded into a computer or other programmable data processing device to enable a series of operating steps to be executed on a computer or other programmable device to generate a computer implemented process, and instructions executed on the computer or other programmable device provide steps for implementing functions specified in one or more flows in the flow charts and/or one or more blocks in the block diagrams.

What is claimed is:

1. A method for compressing a data block, performed by a data transmitting terminal which is configured to carry multiple services on a radio bearer, wherein each service corresponds to a compression buffer, the method comprises:
   determining a first compression buffer corresponding to a service to which a first data block to be transmitted belongs;
   compressing the first data block using a dictionary corresponding to the first compression buffer to obtain a compressed second data block;
   packaging the second data block into a protocol data unit (PDU) and adding a compression identifier for indicating the first compression buffer in a PDU header; and
   transmitting the PDU carrying the compression identifier to a data receiving terminal.

2. The method according to claim 1, wherein the PDU is a packet data convergence protocol (PDCP) PDU;
   the adding a compression identifier for indicating the first compression buffer in a PDU header comprises:
   adding the compression identifier in a PDCP header of the PDCP PDU.

3. The method according to claim 2, wherein the adding the compression identifier in a PDCP header of the PDCP PDU comprises:
   determining a setting field for carrying the compression identifier in the PDCP header; and
   adding the compression identifier in the setting field.

4. The method according to claim 1, wherein the compression identifier comprises one or more of the following items:
   a compression buffer identifier of the first compression buffer;
   a dictionary identifier corresponding to the first compression buffer;
   a service identifier corresponding to the first compression buffer.

5. The method according to claim 1, further comprising:
   receiving a first message transmitted by a network device, wherein the first message comprises compression information configured by the network device for a service to be compressed; and
   establishing a compression buffer corresponding to the service to be compressed according to the compression information.

6. The method according to claim 5, wherein the compression information comprises one or more of the following items:
   a compression buffer identifier and/or a decompression buffer identifier;
   a dictionary identifier;
   compression buffer information and/or decompression buffer information;
   a service identifier.

7. The method according to claim 1, further comprising:
   receiving a second message transmitted by a network device, wherein the second message comprises release information configured by the network device for a service to be released; and
   releasing a compression buffer corresponding to the service to be released according to the release information.

8. The method according to claim 7, wherein the release information comprises one or more of the following items:
   a compression buffer identifier and/or a decompression buffer identifier;
   a dictionary identifier; or
   a service identifier.

9. The method according to claim 1, further comprising:
   updating a content of the dictionary corresponding to the first compression buffer with the first data block.

10. A method for compressing a data block, performed by a data receiving terminal which is configured to receive multiple compressed services carried on a radio bearer, wherein each service corresponds to a decompression buffer, the method comprises:
    receiving a protocol data unit (PDU) carrying a compression identifier transmitted by a data transmitting terminal, wherein the compression identifier is used for indicating a first compression buffer corresponding to a service to which a received first data block belongs, and the PDU comprises a second data block, the second data block is a compressed first data block by the data transmitting terminal using a dictionary corresponding to the first compression buffer;
    determining a first decompression buffer corresponding to the first compression buffer according to the compression identifier; and
    decompressing the second data block using a dictionary corresponding to the first decompression buffer to obtain the first data block.

11. The method according to claim 10, wherein the PDU is a packet data convergence protocol (PDCP) PDU; and a PDCP header of the PDCP message comprises the compression identifier.

12. The method according to claim 11, wherein a setting field for carrying the compression identifier in the PDCP header comprises the compression identifier.

13. The method according to claim 10, wherein the compression identifier comprises one or more of the following items:
- a compression buffer identifier of the first compression buffer;
- a dictionary identifier corresponding to the first compression buffer;
- a service identifier corresponding to the first compression buffer.

14. The method according to claim 10, further comprising:
- receiving a first message transmitted by network device, wherein the first message comprises compression information configured by the network device for a service to be compressed; and
- establishing a decompression buffer corresponding to the service to be compressed according to the compression information.

15. The method according to claim 14, wherein the compression information comprises one or more of the following items:
- a compression buffer identifier and/or a decompression buffer identifier;
- a dictionary identifier;
- compression buffer information and/or decompression buffer information;
- a service identifier.

16. The method according to claim 10, further comprising:
- receiving a second message transmitted by a network device, wherein the second message comprises release information configured by the network device for a service to be released; and
- releasing a decompression buffer corresponding to the service to be released according to the release information.

17. The method according to claim 16, wherein the release information comprises one or more of the following items:
- a compression buffer identifier and/or a decompression buffer identifier;
- a dictionary identifier;
- a service identifier.

18. The method according to claim 10, further comprising:
- updating a content of the dictionary corresponding to the first decompression buffer with the first data block.

19. An apparatus for compressing:
- a data block configured to receive multiple services carried on a radio bearer, wherein each service corresponds to a compression buffer, the apparatus comprising a memory, a transceiver, and a processor,
- wherein the memory is used for storing computer programs, the transceiver is used for receiving and transmitting a data block under a control of the processor, and the processor is used for reading the computer programs in the memory and performing the method according to claim 10.

20. An apparatus for compressing:
- a data block, configured to carry multiple services on a radio bearer, wherein each service corresponds to a compression buffer, the apparatus comprises a memory, a transceiver, and a processor,
- wherein the memory is used for storing computer programs, the transceiver is used for receiving and transmitting a data block under a control of the processor, and the processor is used for reading the computer programs in the memory and performing the following operations:
- determining a first compression buffer corresponding to a service to which a first data block to be transmitted belongs;
- compressing the first data block using a dictionary corresponding to the first compression buffer to obtain a compressed second data block;
- packaging the second data block into a protocol data unit (PDU) and adding a compression identifier for indicating the first compression buffer in a PDU header; and
- transmitting the PDU carrying the compression identifier to a data receiving terminal.

\* \* \* \* \*